(12) United States Patent
Kang

(10) Patent No.: US 8,637,939 B2
(45) Date of Patent: Jan. 28, 2014

(54) SEMICONDUCTOR DEVICE AND METHOD FOR FABRICATING THE SAME

(75) Inventor: Kyung-Doo Kang, Gyeonggi-do (KR)

(73) Assignee: Hynix Semiconductor Inc., Gyeonggi-do (KR)

(*) Notice: Subject to any disclaimer, the term of this patent is extended or adjusted under 35 U.S.C. 154(b) by 110 days.

(21) Appl. No.: 12/825,007

(22) Filed: Jun. 28, 2010

(65) Prior Publication Data

US 2011/0156171 A1     Jun. 30, 2011

(30) Foreign Application Priority Data

Dec. 30, 2009 (KR) .................. 10-2009-0134899

(51) Int. Cl.
*H01L 29/66* (2006.01)
*H01L 21/02* (2006.01)

(52) U.S. Cl.
USPC ........................ 257/403; 257/408; 257/409

(58) Field of Classification Search
USPC ............................................ 257/402, 330
See application file for complete search history.

(56) References Cited

U.S. PATENT DOCUMENTS

| 6,599,819 B1* | 7/2003 | Goto ............................ 438/542 |
| 7,279,734 B2* | 10/2007 | Jung ............................ 257/314 |
| 2004/0026736 A1* | 2/2004 | Grupp et al. .................. 257/330 |
| 2005/0280102 A1* | 12/2005 | Oh et al. ...................... 257/401 |
| 2008/0179752 A1* | 7/2008 | Yamauchi et al. ............ 257/768 |
| 2009/0179274 A1* | 7/2009 | Jung ............................ 257/365 |

FOREIGN PATENT DOCUMENTS

| JP | 2006-128427 | 5/2006 |
| JP | 2006-261232 | 9/2006 |
| JP | 2007-027738 | 2/2007 |
| KR | 1020050070932 | 7/2005 |

OTHER PUBLICATIONS

Notice of Allowance issued by the Korean Intellectual Property Office on Feb. 8, 2012.
Notice of Preliminary Rejection issued from Korean Intellectual Property Office on Jun. 23, 2011.

* cited by examiner

*Primary Examiner* — Walter H Swanson
*Assistant Examiner* — Wilner Jean Baptiste
(74) *Attorney, Agent, or Firm* — IP & T Group LLP

(57) ABSTRACT

A semiconductor device includes a channel layer formed over a substrate, a gate formed over the channel layer, junction regions formed on both sides of the channel layer to protrude from the substrate, and a buried barrier layer formed between the channel layer and the junction regions.

11 Claims, 5 Drawing Sheets

SEMICONDUCTOR DEVICE AND METHOD FOR FABRICATING THE SAME

CROSS-REFERENCE TO RELATED APPLICATIONS

The present application claims priority of Korean Patent Application No. 10-2009-0134899, filed on Dec. 30, 2009, which is incorporated herein by reference in its entirety.

BACKGROUND OF THE INVENTION

Exemplary embodiments of the present invention relate to a semiconductor device fabrication technology, and more particularly, to a semiconductor device and a method for fabricating the same, which can prevent an occurrence of gate-induced drain leakage (GIDL) current and improve drain-induced barrier lowering (DIBL) characteristics.

As the degree of integration of a semiconductor device increases, it becomes more difficult for the semiconductor device to meet the desired operation characteristics thereof. In particular, in the case of a mobile product which calls for higher performance in terms of leakage current characteristics, as the degree of integration of a semiconductor device increases, the thickness of a gate dielectric layer decreases and thus, the occurrence of GIDL current has gradually increased. Also, as a channel length decreases according to the increase in the degree of integration, DIBL characteristics have gradually deteriorated. Hereafter, the above-described concerns in a conventional semiconductor device are illustrated with reference to FIG. 1.

FIG. 1 is a cross-sectional view illustrating a conventional semiconductor device.

Describing a conventional method for fabricating a semiconductor device with reference to FIG. 1, a threshold voltage regulation layer 19 for controlling a threshold voltage is formed on the entire surface of a substrate 11 by an ion implantation process. A gate 15 is formed to have a stack structure in which a gate dielectric layer 12, a gate electrode 13 and a gate hard mask layer 14 are sequentially stacked, and lightly doped drain (LDD) regions 16 are formed in the substrate 11 under both side portions of the gate 15. Spacers 17 are formed on both sidewalls of the gate 15 and junction regions 18 are formed in the substrate 11 on both sides of the gate 15.

The GIDL current is influenced by an electric field created in an area where the gate 15 and the junction regions 18 overlap each other. Therefore, in the conventional art, the occurrence of the GIDL current is suppressed by a method of forming the LDD regions 16, that is, low concentration junction regions having a relatively lower impurity doping concentration than the junction regions 18, in the area where the gate 15 and the junction regions 18 overlap each other.

However, as the degree of integration of a semiconductor device increases, it is difficult to suppress the occurrence of the GIDL current by the method of forming the LDD regions 16, and thus, there are demands for a more fundamental method to suppress the occurrence of the GIDL current.

Under these trends, in order to suppress the occurrence of the GIDL current, techniques developed where the thickness of the gate dielectric layer 12 under both side portions of the gate 15 is set to be greater than the thickness of the gate dielectric layer 12 under the center portion of the gate 15 or where an impurity doping concentration or a work function in the gate electrode 13 is locally controlled. Regardless, these techniques often do not uniformly control the threshold voltage value of the semiconductor device. As a consequence, a concern is caused in that the reliability of the semiconductor device likely deteriorates.

Furthermore, in the conventional semiconductor device, the DIBL characteristics are influenced by a short channel effect (SCE). An ion implantation technique such as halo ion implantation has been used in order to improve the DIBL characteristics.

However, as the degree of integration of a semiconductor device increases and a channel length decreases, it is difficult to improve the DIBL characteristics by the ion implantation technique such as halo ion implantation, and thus, another approach to address above discussed concerns may be useful.

Furthermore, as the degree of integration of a semiconductor device increases, if the impurity doping concentration of the threshold voltage regulation layer 19 is increased so as to control a threshold voltage, the operation characteristics of the semiconductor device may further deteriorate due to the occurrence of the GIDL current and the deterioration of the DIBL characteristics.

SUMMARY OF THE INVENTION

Exemplary embodiments of the present invention are directed to a semiconductor device and a method for fabricating the same, which can prevent the occurrence of GIGL current and improve DIBL characteristics.

In accordance with an embodiment of the present invention, a semiconductor device includes a channel layer formed over a substrate, a gate formed over the channel layer, junction regions formed on both sides of the channel layer to protrude from the substrate, and a buried barrier layer formed between the channel layer and the junction regions.

In accordance with another embodiment of the present invention, a method for fabricating a semiconductor device includes forming a channel layer over a substrate, forming a buried barrier layer over surfaces of the channel layer, forming a conductive layer to cover the substrate, forming junction regions protruding from the substrate on both sides of the channel layer and forming the buried barrier layer between the channel layer and the junction regions by planarizing the conductive layer and the buried barrier layer to expose an upper surface of the channel layer, and forming a gate over the channel layer.

DESCRIPTION OF SPECIFIC EMBODIMENTS

Figure 1:
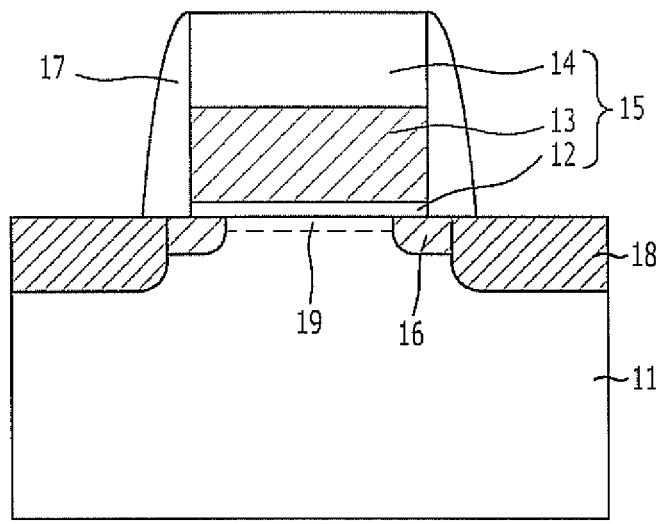
FIG. 1 is a cross-sectional view illustrating a conventional semiconductor device.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Embodiments of the present invention, which is described below, provide a semiconductor device and a method for fabricating the same, which can substantially prevent the occurrence of GIDL current due to an electric field created in an area where a gate and junction regions overlap each other and can improve DIBL characteristics which deteriorate due to a decrease in a channel length (that is, a short channel effect).

Figure 2:
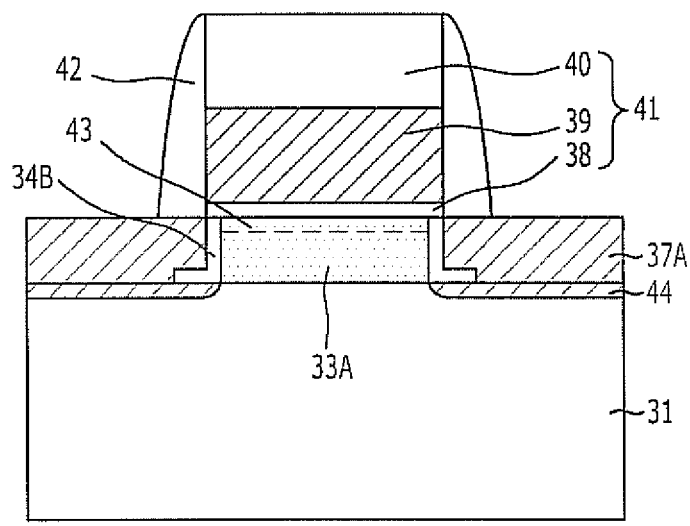
FIG. 2 is a cross-sectional view illustrating a semiconductor device in accordance with an embodiment of the present invention.

FIG. 2 is a cross-sectional view illustrating a semiconductor device in accordance with an embodiment of the present invention.

Referring to FIG. 2, a semiconductor device in accordance with the embodiment of the present invention includes a channel layer 33A configured to be formed over a substrate 31, a gate 41 configured to be formed over the channel layer 33A, junction regions 37A configured to protrude from the substrate 31 on both sides of the channel layer 33A or the gate 41, and a buried barrier layer 34B configured to be interposed between the channel layer 33A and the junction regions 37A. The semiconductor device may further include a threshold voltage regulation layer 43 configured to be formed in the channel layer 33A, shallow junction regions 44 configured to be formed in the substrate 31 under the junction regions 37A, and spacers 42 configured to be formed on both sidewalls of the gate 41.

The channel layer 33A formed over the substrate 31 functions to increase the channel length of the semiconductor device and to substantially remove/reduce an area where the gate 41 and the junction regions 37A overlap each other. That is to say, the channel layer 33A functions to substantially prevent the deterioration of the DIBL characteristics and the occurrence of the GIDL current.

In detail, since the channel layer 33A protrudes from the substrate 31, the surfaces, that is, the upper surface and the sidewall surfaces, of the channel layer 33A serve as a channel, whereby the channel length of the semiconductor device can be increased. Accordingly, a short channel effect due to a decrease in channel length can be avoided, and through this, the DIBL characteristics can be prevented from deteriorating. Furthermore, because the channel layer 33A and the gate 41 can be formed using the same mask, that is, a gate mask, a structure in which the sidewalls of the gate 41 and the sidewalls of the channel layer 33A are aligned with each other can be achieved. Through this, by removing/reducing the area where the gate 41 and the junction regions 37A overlap each other, it can prevent/reduce the occurrence of the GIDL current due to an electric field created in the overlapped area.

The channel layer 33A functioning as described above may be formed of the same material as the substrate 31, and may include an epitaxial layer formed through an epitaxial growth method. For example, in the case of using a silicon substrate as the substrate 31, the channel layer 33A may include an epitaxial silicon layer.

The junction regions 37A protruding from the substrate 31 function to form the shallow junction regions 44 for improving the DIBL characteristics and lessen the difficulty in a subsequent plug forming process. The junction regions 37A can include a silicon layer doped with impurities. The conductivity type of the impurities doped into the junction regions 37A may be complementary to the conductivity type of the substrate 31 or the channel layer 33A. For example, in the case of an N-type MOS device, the junction region 37A may include a silicon layer doped with N-type impurities, and the substrate 31 or the channel layer 33A may have a P-type conductivity. In the case of a P-type MOS device, the junction regions 37A may include a silicon layer doped with P-type impurities, and the substrate 31 and the channel layer 33A may have an N-type conductivity.

The height of the junction regions 37A from the upper surface of the substrate 31 may be the same as or lower than the height of the channel layer 33A. In other words, the upper surfaces of the junction regions 37A may be flush to or be positioned lower than the upper surface of the channel layer 33A. If the height of the junction regions 37A is greater than the height of the channel layer 33A, as the parasitic capacitance between the junction regions 37A and a gate electrode 39 of the gate 41 increases, the operation characteristics of the semiconductor device may deteriorate, and in an extreme case, the junction regions 37A and the gate electrode 39 are likely to be electrically short-circuited so that the semiconductor device cannot normally operate.

The shallow junction regions 44 formed in the substrate 31 under the junction regions 37A may be formed by the fact that the impurities doped into the junction regions 37A are diffused to the substrate 31 under the junction regions 37A. Since the shallow junction regions 44 have a shallow junction depth, the DIBL characteristics can be improved.

The buried barrier layer 34B interposed between the channel is layer 33A and the junction regions 37A functions to electrically isolate the channel layer 33A from the junction regions 37A. The buried barrier layer 34B can include a dielectric layer, for example, any single layer selected from the group consisting of an oxide layer, a nitride layer and an oxynitride layer or a stack layer thereof.

The gate 41 can have a stack structure in which a gate dielectric layer 38, the gate electrode 39 and a gate hard mask layer 40 are sequentially stacked over the channel layer 33A. The gate dielectric layer 38 and the gate hard mask layer 40 can include any single layer selected from the group consisting of an oxide layer, a nitride layer and an oxynitride layer or a stack layer thereof, and the gate electrode 39 can include a silicon layer, a metallic layer, etc.

In order to substantially prevent the occurrence of the area where the gate 41 and the junction regions 37A overlap each other, it is preferred that the gate 41 be formed to have a structure in which the sidewalls of the gate 41 be aligned with the sidewalls of channel layer 33A or the sidewalls of the buried barrier layer 34B.

In the semiconductor device in accordance with the embodiment of the present invention, constructed as mentioned above, even when the thickness of the gate dielectric layer 38 decreases or/and the impurity doping concentration of the threshold voltage regulation layer 43 increases, the occurrence of the area where the gate 41 and the channel layer 33A overlap each other is substantially prevented, whereby the occurrence of the GIDL current can be substantially avoided.

Moreover, as a channel length is increased through the channel layer 33A, the deterioration of the DIBL characteristics can be substantially prevented. In addition, since the shallow junction regions 44 are formed in the substrate 31 under the junction regions 37A, the deterioration of the DIBL characteristics can be effectively prevented/reduced.

Through this, even when the impurity doping concentration of the threshold voltage regulation layer 43 increases, the deterioration of the DIBL characteristics can be substantially prevented.

In this way, the embodiment of the present invention provides a semiconductor device which can substantially prevent the occurrence of the GIDL current and improve the DIBL characteristics. As a consequence, the characteristics and the manufacturing yield of the semiconductor device can be improved.

FIGS. 3A to 3G are cross-sectional views illustrating a method for fabricating a semiconductor device in accordance with an embodiment of the present invention.

Figure 3A:
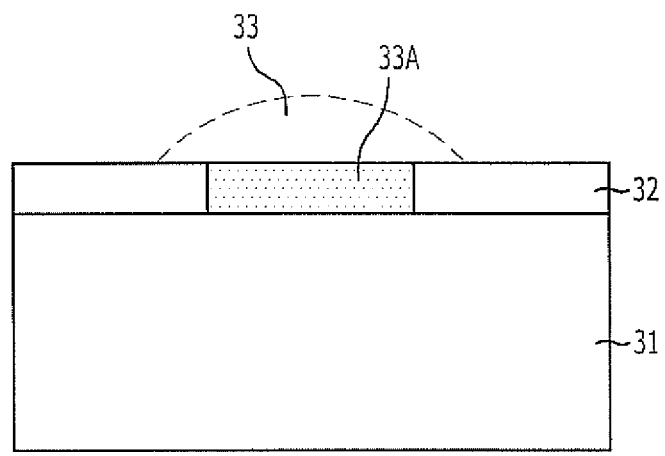
FIGS. 3A to 3G are cross-sectional views illustrating a method for fabricating a semiconductor device in accordance with an embodiment of the present invention.

Referring to FIG. 3A, sacrificial patterns 32 are formed over a substrate 31. The sacrificial patterns 32 are to define an area in which a channel layer is to be formed. The sacrificial patterns 32 may be formed through a series of processes of forming a sacrificial layer (not shown) over the entire surface of the substrate 31 and etching the sacrificial layer using a gate mask in such a way as to expose the substrate 31 in a gate forming area.

The sacrificial patterns 32 may be formed as a dielectric layer. As the dielectric layer, any single layer selected from the group consisting of an oxide layer, a nitride layer and an oxynitride layer or a stack layer thereof can be used.

A semiconductor layer 33 for a channel (Hereinafter, referring to as "a channel semiconductor layer") is formed to sufficiently fill the space between the sacrificial patterns 32. It is preferred that the channel semiconductor layer 33 be formed using the same material as the substrate 31 and have the same lattice structure as the substrate 31. Accordingly, in the case of using a silicon substrate as the substrate 31, the channel semiconductor layer 33 may include a silicon layer, or may include an epitaxial layer which is formed through an epitaxial growth method in such a way as to have the same lattice structure as the substrate 31. Namely, the channel semiconductor layer 33 may be formed as an epitaxial silicon layer.

By planarizing the channel semiconductor layer 33 in such a way as to expose the upper surfaces of the sacrificial patterns 32, a channel layer 33A which is filled between the sacrificial patterns 32 is formed. The planarization process may be conducted through a chemical mechanical polishing (CMP) process.

Figure 3B:
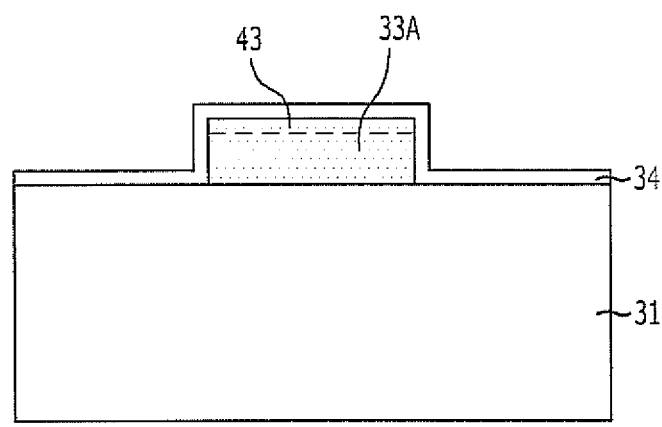

Referring to FIG. 3B, after removing the sacrificial patterns 32, a first dielectric layer 34 is formed on the surface of the resultant structure including the channel layer 33A. The first dielectric layer 34 functions to electrically isolate the channel layer 33A from junction regions which is formed to protrude from the substrate 31 through a subsequent process, and to protect the channel layer 33A during subsequent processes.

The first dielectric layer 34 functioning as described above may be formed as any single layer selected from the group consisting of an oxide layer, a nitride layer and an oxynitride layer or a stack layer thereof.

By ion-implanting impurities for controlling a threshold voltage into the channel layer 33A through using the first dielectric layer 34 as a screen barrier, a threshold voltage regulation layer 43 is formed. Although not shown in the drawings, the threshold voltage regulation layer 43 may also be formed in the substrate 31 when ion-implanting the impurities for controlling a threshold voltage. However, the threshold voltage regulation layer 43 formed in the substrate 31 is removed when subsequently forming junction regions and shallow junction regions, thereby having no negative influence on the operation of the semiconductor device.

Figure 3C:
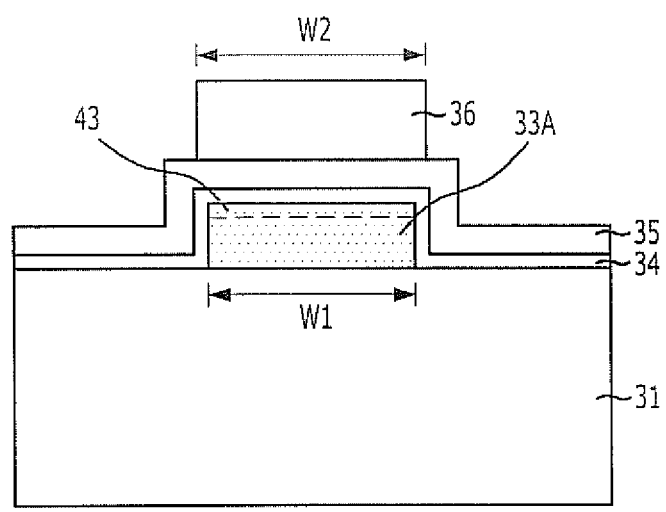

Referring to FIG. 3C, a second dielectric layer 35 is formed over the first dielectric layer 34. The second dielectric layer 35 serves as a barrier in a halo ion implantation process that is usually conducted for improving the DIBL characteristics. Accordingly, the second dielectric layer 35 may be formed as any single layer selected from the group consisting of an oxide layer, a nitride layer and an oxynitride layer or a stack layer thereof. It is preferred that the second dielectric layer 35 be formed using a material having a high etching selectivity compared to that of the first dielectric layer 34. For example, when the first dielectric layer 34 is formed as an oxide layer, it is preferred that the second dielectric layer 35 be formed as a nitride layer.

A photoresist pattern 36 is formed over the second dielectric layer 35. The photoresist pattern 36 is to remove portions of the first and second dielectric layers 34 and 35 which remain in a desired area. The width W2 of the photoresist pattern 36 may be the same as or greater than the width W1 of the channel layer 33A (W1=W2 or W1<W2). The photoresist pattern 36 may be formed using the gate mask. The photoresist pattern 36 which has the width greater than that of the channel layer 33A (W1<W2) may be formed using the gate mask by regulating exposure energy, etc.

Figure 3D:
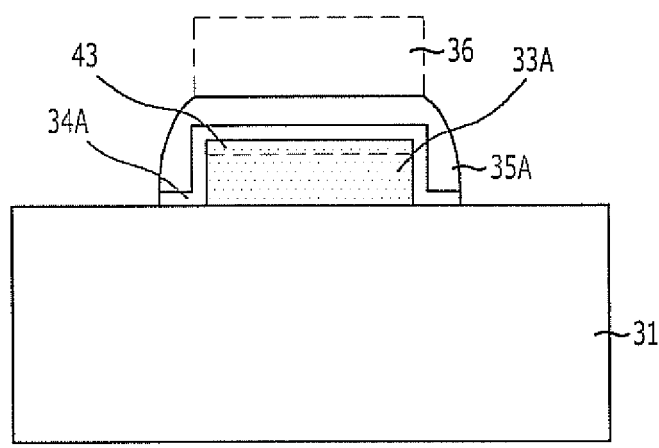

Referring to FIG. 3D, by conducting a blanket etching process using the photoresist pattern 36 as an etch barrier, the first and second dielectric layers 34 and 35 are etched. Even when the width of the photoresist pattern 36 is the same as the width of the channel layer 33A, the first and second dielectric layers 34 and 35 remain on both sidewalls of the channel layer 33A due to the characteristics of the blanket etching process. Hereafter, the etched first and second dielectric layers 34 and 35 are designated by reference numerals 34A and 35A, respectively.

After removing the photoresist pattern 36, a halo ion implantation process and an ion implantation process for forming LDD regions (not shown) are conducted using the first and second dielectric layers 34A and 35A as ion implantation barriers. The halo ion implantation process is to improve the DIBL characteristics, and means a process of ion-implanting impurities into the substrate 31 under both side portions of the channel layer 33A. The ion implantation process for forming LDD regions means a process of ion-implanting impurities into the surface of the substrate 31 under both side portions of the channel layer 33A so as to prevent/reduce the occurrence of the GIDL current. Halo ion implantation regions are positioned under the LDD regions in the substrate 31.

Figure 3E:
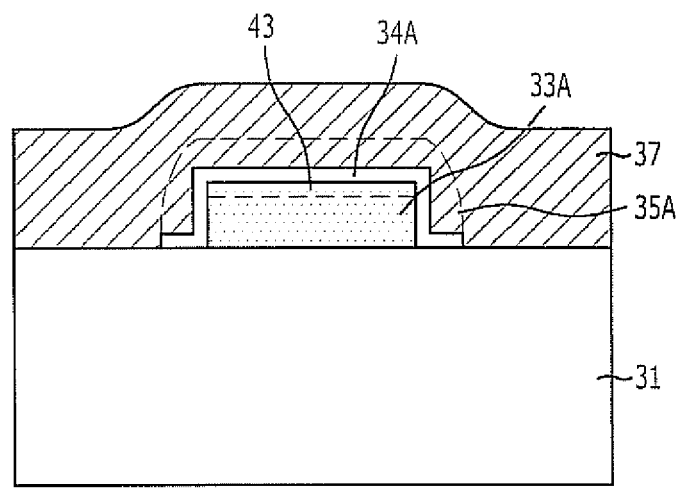

Referring to FIG. 3E, the second dielectric layer 35A is removed.

Meanwhile, since the semiconductor device in accordance with the embodiment of the present invention, which has the structure shown in FIG. 2, includes the protruding junction regions and shallow junction regions, the DIBL characteristics may be improved. Therefore, as the case may be, the halo ion implantation process may be omitted. Also, since the semiconductor device can substantially prevent the occurrence of the GIDL current by having a buried barrier layer, the ion implantation process for forming the LDD regions may be omitted as the case may be. Accordingly, in the method for fabricating a semiconductor device in accordance with another embodiment of the present invention, as the case may be, the processes for forming the second dielectric layer 35 and etching the second dielectric layer 35, the halo ion implantation process, the ion implantation process for forming the LDD regions, and the etching process for removing the second dielectric layer 35A can be omitted.

A conductive layer 37 for forming junction regions protruding from the substrate 31 is formed over the entire surface of the substrate 31. The conductive layer 37 may be formed as a silicon layer doped with impurities. The conductive layer 37 may be formed to have a conductivity type complementary to that of the substrate 31 or the channel layer 33A. For example, in the case of an N-type MOS device, it is preferred that the conductive layer 37 be formed as a silicon layer doped with N-type impurities and the substrate 31 or the channel layer 33A be formed to have a P-type conductivity. In the case of a P-type MOS device, it is preferred that the conductive layer 37 be formed as a silicon layer doped with P-type impurities and the substrate 31 or the channel layer 33A be formed to have an N-type conductivity.

Figure 3F:
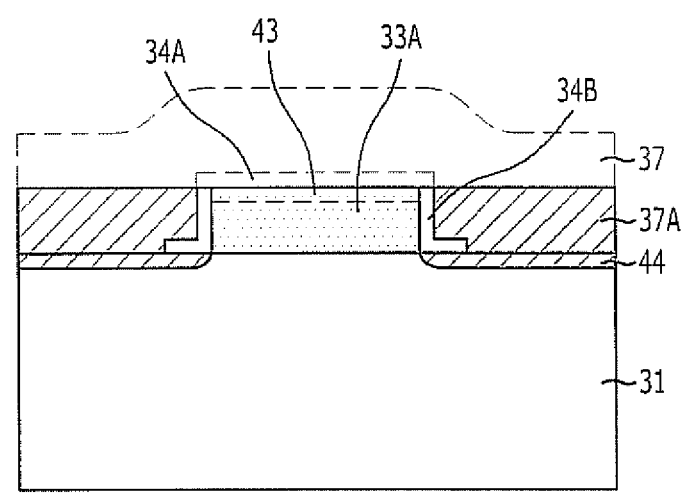

Referring to FIG. 3F, by planarizing the conductive layer 37 and the first dielectric layer 34A in such a way as to expose the upper surface of the channel layer 33A, junction regions 37A, which protrude from the substrate 31 on both sides of the channel layer 33A, and a buried barrier layer 34B, which is interposed between the junction regions 37A and the channel layer 33A, are formed. As the junction regions 37A are formed by planarizing the conductive layer 37, an impurity ion implantation process, which is generally conducted to form the junction regions 37A, can be omitted.

By diffusing the impurities in the junction regions 37A into the substrate 31 under the junction regions 37A through an annealing process, shallow junction regions 44 are formed. The annealing process for forming the shallow junction regions 44 may be conducted immediately after depositing the conductive layer 37, immediately after forming the junction regions 37A, or after subsequently forming a gate.

The junction regions 37A protruding from the substrate 31 functions to form the shallow junction regions 44, thereby improving the DIBL characteristics, and to lessen the difficulty in performing a subsequent plug forming process.

The buried barrier layer 34B interposed between the junction regions 37A and the channel layer 33A functions to electrically isolate the junction regions 37A from the channel layer 33A, and through this, the upper surface of the channel layer 33A and the surfaces of the sidewalls of the channel layer 33A may serve as a channel. That is to say, the buried barrier layer 34B functions to increase the channel length of the semiconductor device and improve the DIBL characteristics which deteriorate due to a short channel effect. Furthermore, the buried barrier layer 34B functions to substantially remove an area where a gate to be formed through a subsequent process and the junction regions 37A overlap each other and to is prevent/reduce the occurrence of the GIDL current.

Figure 3G:
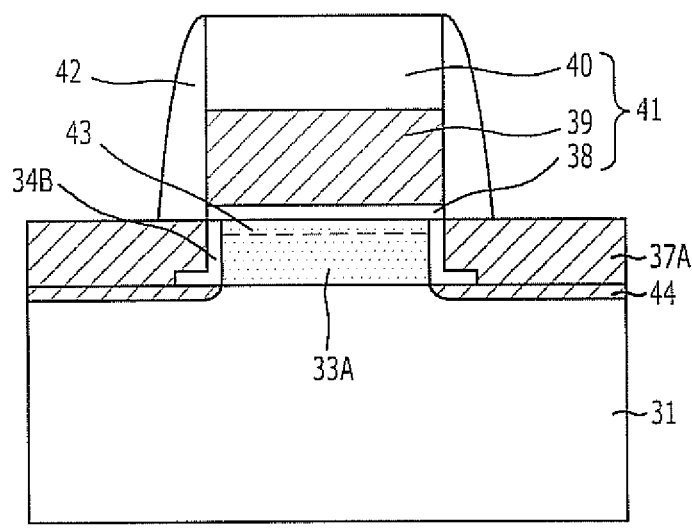

Referring to FIG. 3G, a gate dielectric layer 38, a gate electrode 39 and a gate hard mask layer 40 are sequentially formed over the entire surface of the substrate 31. The gate dielectric layer 38 and the gate hard mask layer 40 may include any single layer selected from the group consisting of an oxide layer, a nitride layer and an oxynitride layer or a stack layer thereof, and the gate electrode 39 may include a silicon layer, a metallic layer, etc.

By sequentially etching the gate hard mask layer 40, the gate electrode 39 and the gate dielectric layer 38 using the gate mask, a gate 41 is formed. Since the channel layer 33A and the gate 41 are formed using the same mask, that is, the gate mask, the sidewalls of the gate 41 may be aligned with the sidewalls of the channel layer 33A or the sidewalls of the buried barrier layer 34B. Accordingly, the gate 41 is formed not to overlap the junction regions 37A, and through this, the GIDL current may be prevented/reduced.

Spacers 42 are formed on both sidewalls of the gate 41.

Through the above-described processes, the fabrication of a semiconductor device in accordance with the embodiment of the present invention is completed. In the method for fabricating a semiconductor device in accordance with the embodiment of the present invention, even when the thickness of the gate dielectric layer decreases or/and the impurity doping concentration of the threshold voltage regulation layer 43 increases, it prevent the gate 41 and the channel layer 33A from overlapping each other, whereby the occurrence of GIDL current may be substantially avoided.

Also, due to the fact that the channel layer 33A is formed, the junction regions 37A are formed to protrude from the substrate 31 on both sides of the channel layer 33A, and the shallow junction regions 44 are formed in the substrate 31 under the junction regions 37A, it prevents DIBL characteristics from deteriorating due to a decrease in a channel length.

As a channel length is increased by the channel layer 33A, the DIBL characteristics can be prevented from deteriorating. Moreover, since shallow junction regions 44 are formed in a substrate under junction regions 37A, it may substantially and effectively prevent the DIBL characteristics from deteriorating. Through this, even when the impurity doping concentration of the threshold voltage regulation layer 43 increases, it may substantially prevent DIBL characteristics from deteriorating.

As a consequence, according to the embodiments of the present invention, a semiconductor device and a method for fabricating the same substantially prevent the occurrence of the GIDL current and improve the DIBL characteristics and improve the characteristics and the manufacturing yield of the semiconductor device.

While the present invention has been described with respect to the specific embodiments, it will be apparent to those skilled in the art that various changes and modifications may be made without departing from the spirit and scope of the invention as defined in the following claims.

What is claimed is:

1. A semiconductor device comprising:
   a channel layer formed over a substrate;
   a gate formed over the channel layer, wherein sidewalls of the gate are aligned with sidewalls of the channel layer;
   junction regions formed on both sides of the channel layer to protrude from the substrate;
   shallow junction regions formed in the substrate under the junction regions, respectively; and
   buried barrier layers formed between the channel layer and the junction regions, wherein each of the buried barrier layers is formed to extend to a portion between the respective junction regions and the respective shallow junction regions.

2. The semiconductor device of claim 1, wherein the junction regions comprise a silicon layer which is doped with impurities.

3. The semiconductor device of claim 2, wherein the shallow junction regions are formed by diffusing the impurities of the junction regions into the substrate.

4. The semiconductor device of claim 1, wherein a height of the junction regions is the same as or less than a height of the channel layer.

5. The semiconductor device of claim 1, wherein the junction regions and the channel layer have conductivity types complementary to each other.

6. The semiconductor device of claim 1, wherein each of the buried barrier layers comprises a dielectric layer.

7. The semiconductor device of claim 1, wherein the channel layer comprises an epitaxial layer.

8. The semiconductor device of claim 7, wherein the channel layer is formed using a same material as the substrate.

9. The semiconductor device of claim 8, wherein the channel layer comprises an epitaxial silicon layer.

10. The semiconductor device of claim 1, further comprising:
   a threshold voltage regulation layer formed in the channel layer.

11. A semiconductor device comprising:
   a channel layer formed over a substrate;
   a gate formed over the channel layer;
   junction regions formed on opposite sides of the channel layer, respectively, to protrude from the substrate;
   shallow junction regions formed in the substrate under the junction regions, respectively; and
   buried barrier layers formed between the channel layer and the junction regions, wherein each of the buried barrier layers is formed to extend to a portion between the respective junction regions and the respective shallow junction regions.

* * * * *